United States Patent [19]
Kishi

[11] Patent Number: 5,989,996
[45] Date of Patent: Nov. 23, 1999

[54] METHOD FOR MANUFACTURING SEMICONDUCTOR DEVICE

[75] Inventor: Akira Kishi, Nara, Japan

[73] Assignee: Sharp Kabushiki Kaisha, Osaka, Japan

[21] Appl. No.: 09/022,009

[22] Filed: Feb. 11, 1998

[30] Foreign Application Priority Data

Mar. 27, 1997 [JP] Japan ..................................... 9-074773

[51] Int. Cl.$^6$ .................................................. H01L 21/28
[52] U.S. Cl. .......................... 438/621; 438/655; 438/664; 438/683; 438/688
[58] Field of Search .................................... 438/586, 597, 438/621, 630, 649, 655, 664, 683, 688

[56] References Cited

U.S. PATENT DOCUMENTS

| | | | |
|---|---|---|---|
| 4,920,069 | 4/1990 | Fossum et al. | 437/90 |
| 5,369,055 | 11/1994 | Chung | 438/533 |
| 5,529,958 | 6/1996 | Yaoita | 438/655 |
| 5,776,822 | 7/1998 | Fujii et al. | 438/586 |

FOREIGN PATENT DOCUMENTS 3-65658  10/1991  Japan .

OTHER PUBLICATIONS

Katz, A., et al., "Metal/Al/Si contacts formed by eutectic rapid thermal melting", J. Vac. Sci. Technol., a 7(3), May/Jun. 1989, pp. 1484–1487.

*Primary Examiner*—T. N. Quach
*Attorney, Agent, or Firm*—Nixon & Vanderhye P.C.

[57] ABSTRACT

A method for manufacturing a semiconductor device includes the steps of: forming a laminated film by forming an aluminum film and a titanium film in this order on P-type and N-type electrically conductive regions of a silicon substrate and forming a silicide layer containing a titanium silicide as a major component on the electrically conductive region by allowing the laminated film to react with silicon constituting the silicon substrate by a first heat treatment.

11 Claims, 2 Drawing Sheets

METHOD FOR MANUFACTURING SEMICONDUCTOR DEVICE

CROSS-REFERENCE TO RELATED APPLICATIONS

This application is related to Japanese application No.HEI 9(1997)-74773, filed on Mar. 27, 1997 whose priority is claimed under 35 USC §119, the disclosure of which is incorporated by reference in its entirety.

BACKGROUND OF THE INVENTION

1. Field of the Inventions

The present invention relates to a method for manufacturing a semiconductor device. More particularly, the present invention relates to a method for manufacturing a semiconductor device containing a salicide process.

2. Related Art

A salicide (self-aligned silicide) process is used very often as a way to reduce resistance of a gate, a source and a drain in order to improve characteristics of a transistor. The salicide process means a process including the steps of: forming the gate, the source and the drain of a transistor; forming a metal film on a surface thereof; and providing a silicide layer having low resistance in the regions of the gate, the source and the drain by allowing the metal film to react with a silicon constituting the gate, the source and the drain by means of an annealing process.

Regions formed of a silicon oxide film, such as a LOCOS oxide film and a side wall spacer, hardly react with a metal. Therefore, by selectively removing an unreacted metal film formed on the surface of such regions by means of etching, the silicide layer having low resistance can be selectively formed on the surface of the gate, the source and the drain without conducting a photolithography process or a complex etching process.

FIG. 2(a) to 2(e) show general schematic sectional views illustrating a salicide process in the case of manufacturing a transistor by means of this salicide process. In FIG. 2(a) to 2(e), reference numeral 21 represents a silicon substrate, 22 represents a well formed in the silicon substrate, 23 represents a gate oxide film, 24 represents a LOCOS oxide film, 25 represents a gate made of polysilicon, 26 represents a source, 27 represents a drain, 28 represents a side wall spacer, 29a and 29b each represent a silicide layer formed on a surface of the gate, 30a and 30b each represent a silicide layer formed on the source, 31a and 31b each represent a silicide layer formed on the drain, 32 represents a dielectric film and 33 represents a wiring layer.

Although the following example shows a case in which titanium is used as a metal for forming the silicide layer, cobalt, nickel or the like may also be used as the metal for forming the silicide layer. In such a case, a process for manufacturing the silicide layer is almost the same as in the case of titanium.

First, as shown in FIG. 2(a), a transistor is formed by means of a conventional method. Second, a titanium film 35 is formed by means of a sputtering method, an electron-beam deposition method, a chemical vapor deposition method or the like. Then, an annealing process (first annealing process) is conducted. For this process, a rapid thermal annealing (RTA) method is used in most cases. The annealing process is carried out under an atmosphere of nitrogen gas, so that a titanium nitride layer 34 is formed on a surface of the titanium film 35.

A selective etching process is carried out by using sulfonic acid-hydrogen peroxide or ammonia-hydrogen peroxide to remove the titanium nitride layer 34 and an unreacted titanium remaining on the surface of the side wall spacer or the LOCOS oxide film. In many cases, an annealing process (second annealing process) at high temperature is further conducted. By the first annealing process, a silicide layer of a crystal structure of C49 type having a high resistance is formed. By the second annealing process, the silicide layer of the crystal structure of C49 type is converted into that of a crystal structure of C54 type having a low resistance. The reason why the two annealing processes are carried out before and after the selective etching process is that, if the second annealing process is conducted at a high temperature (usually more than 800° C.) without a selective etching process, surfaces of the side wall spacer and LOCOS oxide film will react violently, making it difficult to remove the unreacted titanium.

As shown in FIG. 2(e), the silicide layer formed on each of the gate, source and drain of an N-type transistor has a thickness smaller than the one formed on each of the gate, source and drain of a P-type transistor.

A sheet resistance of the silicide layer formed by the above process changes depending on the condition in which an impurity is implanted into a region where the salicide is formed. For example, when high-concentration arsenic is used as an N-type impurity, formation of the silicide layer and transformation of the crystal structure of the silicide layer from the one having a high resistance (C49 type) into the one having a low resistance (C54 type) are inhibited. These phenomena occur because arsenic delays the reaction of producing the silicide layer and inhibits the reaction of transformation from the C49 type crystal structure having a high resistance to the C54 type structure having a low resistance. Therefore, according to the conventional process for manufacturing a salicide layer, the sheet resistance of the silicide layer is larger than that in the N-region wherein arsenic has been implanted than that in the P-region wherein boron (B) or boron difluoride ($BF_2$) (P-type impurity) has been implanted. These phenomena cause troubles because the effect produced therefrom will be larger according as a size reduction of the device develops. Therefore, there is necessity for solutions to this problem under the design rule of 0.25 $\mu$m or less.

In the salicide process, silicon in the gate, source and drain reacts with a metal to form the silicide layer. Therefore, in the case that a junction is shallow because of the size reduction of a transistor, the silicon layers constituting the source and drain between the silicide layer and the substrate or between the silicide layer and the well become thin, so that the salicide layer is not uniform in the N-region and in the P-region. As a result, the junction is partially destroyed and a distance between the silicide layer and the junction becomes short. Accordingly, because of a titanium diffusion, the deterioration of the junction occurs and the amount of leak current increases. Therefore, the formation of a thick silicide layer for reduction of the sheet resistance of the gate, source and drain should be avoided.

For example, in order to decrease the sheet resistance of the region wherein arsenic is implanted, it can be proposed that a titanium film is made thicker to form a thicker silicide layer in the region wherein arsenic is implanted. However, by means of this method, the silicide layer in the region wherein boron is implanted will be thicker than is necessary. Therefore, to avoid the destruction of junction by the silicide layer, it is necessary to make a deep diffusion layer in the region wherein boron is implanted. This increases a short channel effect, so that a performance of the P-type transistor is deteriorated.

Accordingly, there has been a longing for suppressing the increase of the sheet resistance in the region wherein arsenic is implanted without affecting the structure and performance of a P-type transistor. A method involves use of a cobalt silicide layer which is less affected by implantation of arsenic instead of a titanium silicide layer in order to suppress the increase of the sheet resistance. However, the cobalt silicide layer has a disadvantage such that this layer tends to cause a junction leak. In the case of the titanium silicide layer, the sheet resistance of the silicide layer wherein arsenic is implanted can be reduced by a method which involves implantation of silicon ions into the source and drain prior to forming the salicide layer. However, this method leads to increased costs.

SUMMARY OF THE INVENTION

Thus, the present invention provides a process of manufacturing a semiconductor device, comprising the steps of: forming a laminated film by forming an aluminum film and a titanium film in this order on a desired electrically conductive region of a silicon substrate and forming a silicide layer containing a titanium silicide as a major component on the electrically conductive region by allowing the laminated film to react with silicon constituting the silicon substrate by a first heat treatment.

According to the above process, the silicide layer in the region where arsenic is implanted can be formed to have almost the same thickness and specific resistance as the one formed in the region where boron or boron difluoride is implanted, since aluminum film exists between titanium film and silicon substrate at the time of forming the salicide layer. Therefore, without complex processes, device characteristics can be improved and the manufacturing costs can be decreased.

DETAILED DESCRIPTION OF THE PREFERRED EMBODIMENTS

Figure 1A:
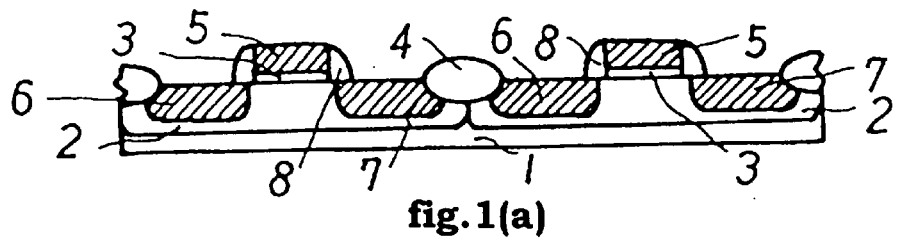
FIGS. 1(a) to 1(e) are schematic sectional views illustrating manufacturing steps for a semiconductor device in accordance with the present invention.

First, in accordance with the manufacturing method of the present invention, a silicon substrate is used having at least one electrically conductive region. The electrically conductive region means a region such as a source, a drain or the like, wherein an impurity (ions) is implanted. Herein, as the impurity, arsenic or the like can be used as an N-type impurity and boron, boron difluoride or the like can be used as a P-type impurity. The electrically conductive region may be formed in a well region. The depth of a region wherein the N-type impurity is implanted (hereafter referred to as N-type impurity region) and the depth of a region wherein the P-type impurity is implanted (hereafter referred to as P-type impurity region) may be appropriately chosen depending on the kind of the semiconductor device. They may be the same or different. In the case that a plurality of N-type impurity regions (or P-type impurity regions) are provided, each of the N-type impurity regions (or P-type impurity regions) may have a different depth.

The electrically conductive region may be formed on the silicon substrate by a known ion implantation method. The impurity may be activated by a heat treatment of the silicon substrate after the implantation of impurity.

On the silicon substrate, components of the semiconductor device such as a device isolation film, a gate insulating film, a gate electrode, a sidewall spacer and the like may be formed in advance.

Then, an aluminum film is formed at least on a desired portion of the above electrically conductive region. A thickness of the aluminum film is not specifically limited as long as the aluminum can be diffused into a titanium layer by the later-performed heat treatment. Specifically, the thickness of the aluminum film is preferably 10 to 75 Å. The process for forming the aluminum film may be an electron-beam deposition method, chemical vapor deposition (CVD) method, sputtering method or the like, but is not limited thereto.

Next, the titanium film is formed on the aluminum film. A thickness of the titanium film is preferably 150 to 700 Å. The forming process for the titanium film may be an electron-beam deposition method, CVD method, sputtering method or the like, but is not limited thereto.

After that, by a reaction of titanium and silicon by means of a heat treatment (hereafter referred to as a first heat treatment), the silicon substrate is converted into a silicide layer containing titanium silicide as a major component. In this conversion, the aluminum film is diffused into the silicide layer. A thickness of the silicide layer is preferably 200 to 900 Å. Here, only a portion of the titanium film formed on the aluminum layer over the silicon substrate is converted into the silicide layer, so that a portion of the titanium film formed on the device isolation film and the like is not converted into the silicide layer. The heat treatment is generally conducted in a high vacuum and/or under an atmosphere of an inert gas such as nitrogen gas, preferably at 600–700° C. and for 5–60 seconds. The crystal structure of the titanium silicide obtained by this heat treatment is of C49 type.

The process of the present invention is especially useful in the case of forming the silicide layer both in the N-type conductive region and in the P-type conductive region at the same time. This is because the thickness of the silicide layer formed in the N-type and P-type conductive regions can be almost the same and, moreover, the specific resistance of both silicide layers can be almost the same. On the other hand, by means of the conventional process, the silicide layer formed in the N-type and P-type conductive regions cannot have the same thickness. This gave rise to the problems mentioned in the description of prior arts. The process of the present invention can solve these problems.

According to the process of the present invention, the difference in thickness between the silicide layer formed in the region where the N-type impurity is implanted and the silicide layer formed in the region where the P-type impurity is implanted is 20% or less of a thickness of the thinner of the two silicide layers; the difference in sheet resistance between the silicide layer formed in the region where the N-type impurity is implanted and the silicide layer formed in the region where the P-type impurity is implanted is 20% or less of the stronger sheet resistance of the two silicide layers; and the difference in specific resistance between the silicide layer formed in the region where the N-type impurity is implanted and the silicide layer formed in the region where the P-type impurity is implanted is 10 Ωcm or less.

Then, the titanium film that has not been converted into the silicide layer is removed. Also, if the heat treatment has been conducted under an atmosphere of nitrogen gas, a titanium nitride film formed on the titanium film is removed.

The method for removing the titanium film and the titanium nitride film can be a wet etching method using an etchant such as sulfonic acid-hydrogen peroxide, ammonium hydroxide-hydrogen peroxide or the like.

After this treatment, the crystal structure of titanium silicide in the silicide layer is transformed in phase from C49 type into C54 type by a heat treatment (hereafter referred to a second heat treatment). This second heat treatment is usually conducted in a high vacuum and/or under an atmosphere of an inert gas such as nitrogen gas, preferably at a temperature of 700–900° C. and for 1–60 seconds.

Next, an interlayer dielectric film is formed on the entire silicon substrate. Then, a portion of the interlayer dielectric film is removed on regions where conduction is necessary, for example, a source, a drain, a gate and the like, and a contact hole is formed thereon. A wiring layer is formed over the contact hole, thereby completing the semiconductor device. The interlayer dielectric film, the contact hole and the wiring layer may be formed by methods known in the art.

EXAMPLES

The present invention is now detailed by way of Examples shown below, which are not to limit the scope of the present invention.

Example 1

A sample for Example 1 was manufactured under the following conditions.

A silicon oxide film of 200 Å was formed on a silicon substrate as an implantation-protective film. In the case of implanting an N-type impurity into the substrate, arsenic ions were implanted with an acceleration voltage of 50 keV in a dose of $3.0 \times 10^{15}$ ions/cm$^2$. In the case of implanting a P-type impurity into the substrate, boron ions were implanted with an acceleration voltage of 10 keV in a dose of $2.0 \times 10^{15}$ ions/cm$^2$. Next, in order to activate the implanted ions, the silicon substrate was at first subjected to an annealing process in a furnace at 850° C. for 30 minutes and then to an annealing process by means of a RTA method at 1,000° C. for 10 seconds.

Next, by treatment with HF, the implantation-protective film was removed. Then, an aluminum film of thickness 20 Å was formed on the substrate and a titanium film of thickness 550 Å was formed on the aluminum film followed by an annealing process (first annealing process) by means of RTA method at 650° C. for 40 seconds with all the steps being successively conducted in a vacuum. Next, titanium nitride and unreacted titanium were removed by treatment with sulfonic acid-hydrogen peroxide and then, the silicon substrate was subjected to an annealing process (second annealing process) at 850° C. for 10 seconds.

The samples thus obtained were tested for a sheet resistance and for a thickness of silicide layer, and a specific resistance was calculated therefrom. The result is shown in Table 1.

[TABLE 1]

| Sample No. | impurity | aluminum contained or not | sheet resistance (Ω/sq) | thickness of a silicide film (Å) | specific resistance (μΩcm) |
|---|---|---|---|---|---|
| 1 | N-type | contained | 1.75 | 860 | 15.1 |
| 2 | N-type | not | 2.63 | 650 | 17.1 |
| (Comparative) | | contained | | | |
| 3 | P-type | contained | 1.60 | 940 | 15.0 |
| 4 | P-type | not | 1.82 | 870 | 15.8 |
| (Comparative) | | contained | | | |

In Table 1, Comparative Examples (not containing aluminum) are shown for comparison of the effect of the silicide layer obtained by the procedure of the present invention with that of the silicide layer obtained by a conventional method. The Comparative Examples were prepared by using the above-mentioned operations without forming the aluminum film. No available documents provide reports on the specific resistance value obtained from a sample prepared under completely the same condition as these Examples (including the conditions of implantation and annealing). However, a specific resistance is generally assumed to be 15 to 16 μΩcm. In comparison with the substrate into which the P-type impurity has been implanted (hereafter referred to as a P-type sample), the substrate into which the N-type impurity has been implanted (hereafter referred to as an N-type sample) has a smaller film thickness and higher specific resistance. This is considered to be because arsenic (N-type impurity) delays the reaction between titanium and silicon and inhibits the phase-transition from the C49 type crystal structure to the C54 type structure.

According to the present invention, both N-type sample and P-type sample prepared in the Examples provide layer film thickness than the Comparative Examples. However, the ratio of increase in film thickness is 30% for the N-type sample and 8% for the P-type sample. Especially, the ratio of increase for the N-type is large. The specific resistance of both N-type sample and P-type sample in Example 1 is about 15 μΩcm. Accordingly, the present invention provides, in the arsenic-implanted region, the silicide film having a thickness and specific resistance of the same degree as in the boron-implanted region because of less influence by arsenic implantation.

Example 2

FIGS. 1(a) to (e) are illustrations showing manufacturing steps for a semiconductor device in accordance with the present invention. In FIGS. 1(a) to (e), reference numeral 1 represents a silicon substrate, 2 represents a well formed in the silicon substrate, 3 represents a gate oxide film, 4 represents a LOCOS oxide film, 5 represents a gate made of polysilicon, 6 represents a source, 7 represents a drain and 8 represents a side wall spacer. Reference numeral 9 represents a silicide layer formed by reaction of silicon with a laminated film of aluminum and titanium at the gate. Reference numeral 10 represents a silicide layer formed by reaction of silicon with the laminated film of aluminum and titanium at the source. Reference numeral 11 represents a silicide layer formed by reaction of silicon with the laminated film of aluminum and titanium at the drain. Reference numeral 13 represents a dielectric film, 14 represents a wiring layer, 15 represents an aluminum film, 16 represents a titanium film and 17 represents a titanium nitride film.

An example of the manufacturing method of the present invention is described with reference to FIGS. 1(a) to (e).

First, as shown in FIG. 1(a), a transistor was formed by means of a conventional method. In this case, a thickness of the gate oxide film 3 was 70 Å, a thickness of polysilicon constituting the gate 5 was 2,000 Å and a width of the side wall spacer 8 was 1,000 Å. In the case that the source 6/drain 7 was to be formed into a $P^+$ region, boron was used as the kind of ions to be implanted, an acceleration voltage was 10 keV and a dose of the ions was $2 \times 10^{15}$ ions/cm$^2$. In the case that the source 6/drain 7 was to be formed into an $N^+$ region, arsenic was used as the kind of ions to be implanted, an acceleration voltage was 50 keV and a dose of the ions was $3 \times 10^{15}$ ions/cm$^2$.

Figure 1B:
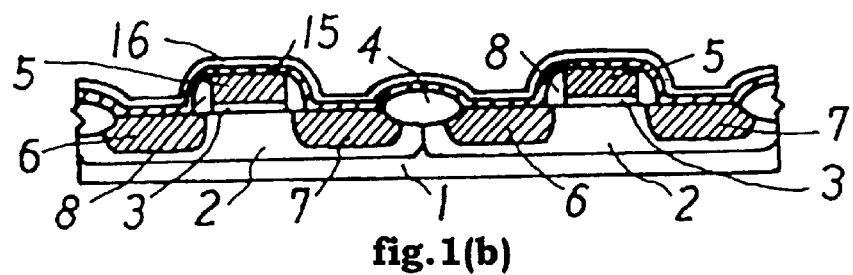

Next, as shown in FIG. 1(b), the aluminum film 15 of thickness 20 Å was formed using an aluminum target and then, the titanium film 16 of thickness 550 Å was formed using a titanium target by means of a sputtering method.

Figure 1C:
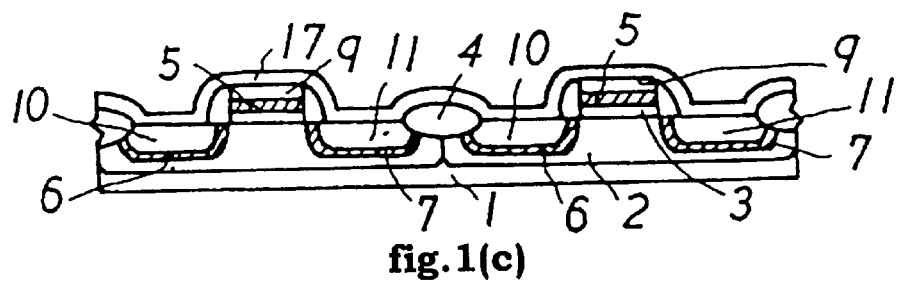

Next, as shown in FIG. 1(c), the silicon substrate was subjected to an annealing process under an atmosphere of nitrogen gas at 650° C. for 40 seconds by means of a RTA method. The annealing process by means of the RTA method was successively conducted using an annealing apparatus united with a sputtering apparatus in an atmosphere of a high vacuum. This is to prevent oxidation of the aluminum film 15 and the titanium film 16 formed. Since the annealing process was conducted under the atmosphere of nitrogen gas, the titanium nitride film 17 (containing aluminum) was formed on the surface of the titanium film, with an unreacted titanium remaining thereunder (not shown).

Figure 1D:
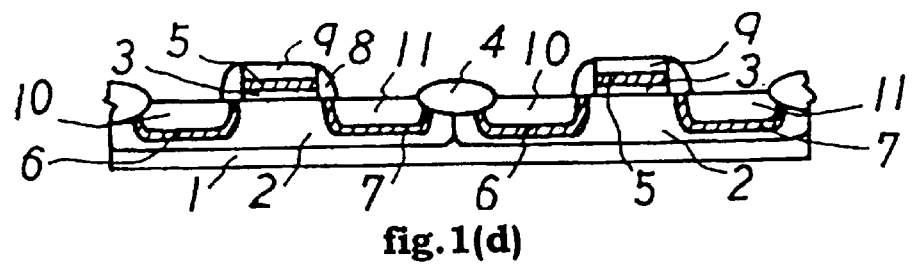

Next, as shown in FIG. 1(d), a selective etching process was conducted with ammonium hydroxide-hydrogen peroxide ($NH_4OH:H_2O_2:H_2O=1:1:5$) to remove the titanium nitride film 17 and a titanium film remaining unreacted on the surface of the side wall spacer, the LOCOS oxide film and the like. The selective etching process was conducted by immersion in ammonium hydroxide-hydrogen peroxide at 60° C. for 4 minutes.

Figure 1E:
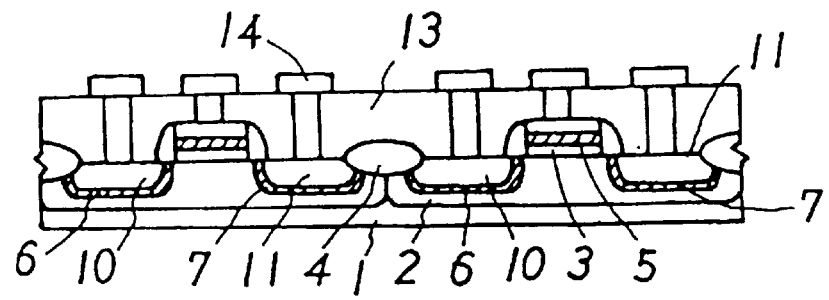
Figure 2A:
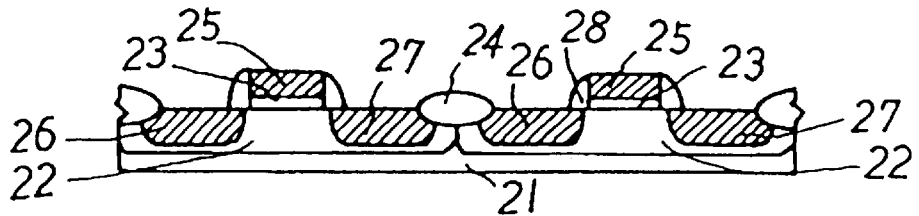
FIGS. 2(a) to 2(e) are schematic sectional views illustrating conventional manufacturing steps for a semiconductor device.
Figure 2B:
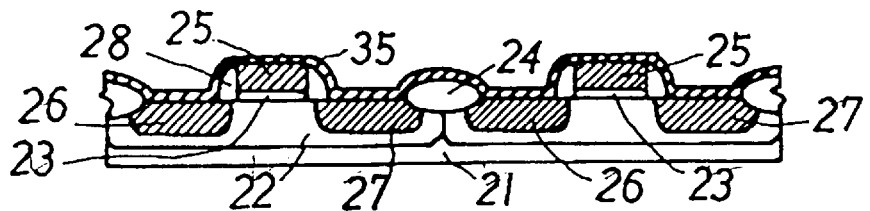
Figure 2C:
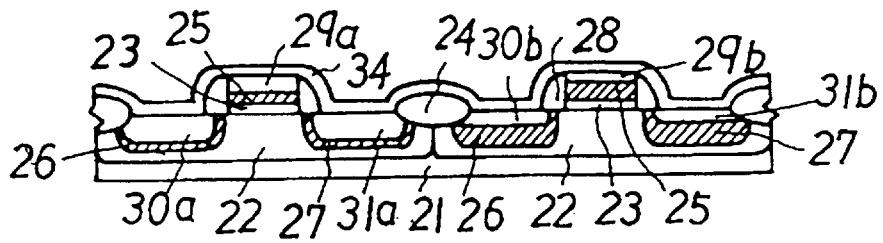
Figure 2D:
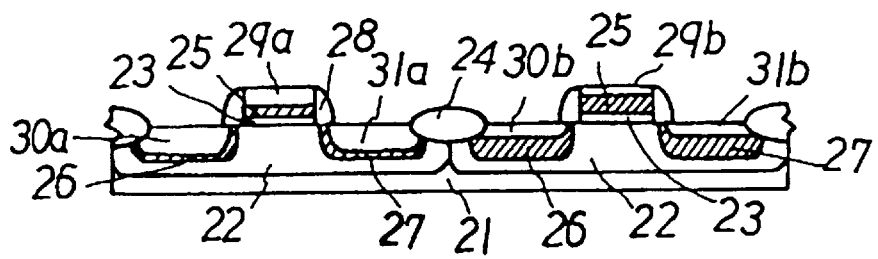
Figure 2E:
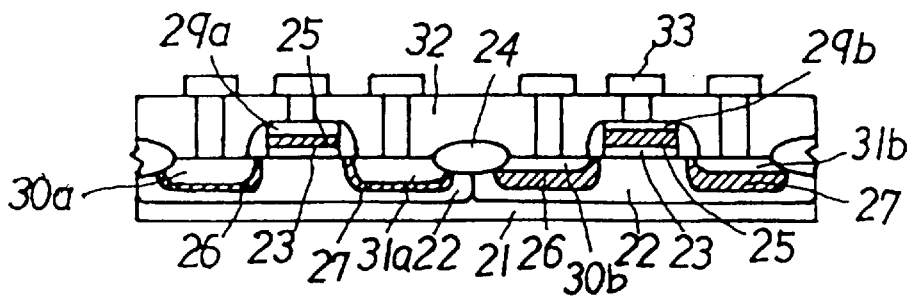

Then, an annealing process at a higher temperature was conducted to change the titanium silicide layer into the silicide layer having a crystal structure (C54 type) of low resistance. The annealing process at the higher temperature was conducted at 850° C. for 10 seconds. After that, as shown in FIG. 1(e), the dielectric layer and the wiring layer were formed by means of a conventional method. The wiring layer was made in a multi-layer structure (not shown). The sheet resistance of the gate, source and drain is 3.1 Ω/sq. In the case that the silicide layer was formed, the junction leak current was the same as in the case that the silicide layer was not formed. In the case that the aluminum film was not formed, its sheet resistance was about 20 Ω/sq. Moreover, in this case, when a fine wiring with a width of 0.5 μm or less was used, a small difference in width caused a large variation in the sheet resistance by about 0.25 Ω/sq.

As detailed above, according to the manufacturing process of the present invention, the gate, source and drain of a fine transistor made under a design rule of 0.25 μm or less can have lower resistance and the junction leak current of the transistor can be reduced.

What is claimed is:

1. A method for manufacturing a semiconductor device, comprising the steps of:
    a. implanting P-type and N-type impurities in a silicon substrate to form respectively P-type and N-type electrically conductive regions in the substrate;
    b. forming a laminated film over the regions by applying an aluminum film and a titanium film in this order on the silicon substrate and
    c. heating the laminated film during a first heat treatment during which the film reacts with the silicon substrate to form a silicide layer over the electrically conductive regions, where the silicide layer is relatively uniform in thickness and contains a titanium silicide as a major component of the silicide.

2. The method of claim 1, wherein the N-type impurity is arsenic and the P-type impurity is boron or boron difluoride.

3. The method of claim 1, wherein a difference in thickness between a silicide layer formed in the region where the N-type impurity is implanted and a silicide layer formed in the region where the P-type impurity is implanted is 20% or less of a thickness of the thinner of the two silicide layers.

4. The method of claim 1, wherein a difference in sheet resistance between a silicide layer formed in the region where the N-type impurity is implanted and a silicide layer formed in the region where the P-type impurity is implanted is 20% or less of the stronger sheet resistance of the two silicide layers.

5. The method of claim 1, wherein the difference in specific resistance between a silicide layer formed in the region where the N-type impurity is implanted and a silicide layer formed in the region where the P-type impurity is implanted is 10 Ωcm or less.

6. The method of claim 1, wherein the silicide layer has a thickness in the range of 200 to 900 Å.

7. The method of claim 1, wherein the silicide layer has a specific resistance in the range of 12 to 20 Ωcm.

8. The method of claim 1, wherein the first heat treatment is conducted under a condition at a temperature of 600 to 700° C. and for 5 to 60 seconds.

9. The method of claim 1, the silicide layer has a C49 crystal structure after the first heat treatment.

10. The method of claim 9, further comprising the steps of: removing an unconverted titanium with silicon after the first heat treatment and conducting second heat treatment, whereby the C49 crystal structure in the silicide layer after the first heat treatment is transformed in phase into a C54 crystal structure.

11. The method of claim 10, wherein the second heat treatment is conducted under a condition at a temperature of 700 to 900° C. and for 1 to 60 seconds.

* * * * *